United States Patent [19]

Del Priore

[11] Patent Number: 4,710,440
[45] Date of Patent: Dec. 1, 1987

[54] TEST MASK FOR DETERMINING ALIGNMENT OF AN AUTOMATIC IC MASK TESTING APPARATUS

[75] Inventor: Paul J. Del Priore, Somerville, N.J.

[73] Assignee: RCA Corporation, Princeton, N.J.

[21] Appl. No.: 885,165

[22] Filed: Jul. 14, 1986

[51] Int. Cl.$^4$ .............................................. G03F 9/00
[52] U.S. Cl. ...................................... 430/5; 428/212; 356/401
[58] Field of Search ........................... 430/5, 22, 321; 356/399, 400, 401, 237; 428/212, 409

[56] References Cited

U.S. PATENT DOCUMENTS

| | | | |
|---|---|---|---|
| 3,771,872 | 11/1973 | Nightingale et al. | 355/125 |
| 3,963,354 | 6/1976 | Feldman et al. | 356/168 |
| 4,218,142 | 8/1980 | Kryger et al. | 356/394 |
| 4,423,959 | 1/1984 | Nakazawa et al. | 356/400 |
| 4,441,250 | 4/1984 | Imahashi | 29/578 |
| 4,532,650 | 7/1985 | Wihl et al. | 382/8 |

FOREIGN PATENT DOCUMENTS 58-194354  11/1983  Japan ..................... 430/22

OTHER PUBLICATIONS

Oldham, W. G., "The Fabrication of Microelectronic Circuits", Scientific American, vol. 237, (3), Sep. 1977, p. 110.

Automated Photomask Inspection: Current Techniques and Trends, George W. Brooks, Microelectronics Manufacturing and Testing, Sep. 1982.

Primary Examiner—John E. Kittle
Assistant Examiner—José G. Dees
Attorney, Agent, or Firm—S. C. Corwin; B. E. Morris

[57] ABSTRACT

A test mask is provided for determining that an automatic IC photomask testing machine is scanning within a desired die area. The test mask includes a plurality of care areas which correspond to the die areas of a mask to be tested. The peripheral region surrounding each care area includes portions which may be opaque and portions which may be transparent. These opaque and transparent portions are arranged so that when two care areas are being scanned and the scan improperly leaves the care area and enters the peripheral region, the portion of the peripheral region of the one care area being scanned is opaque while the portion of the peripheral region of the other care area is transparent. This will be interpreted by the mask testing machine as an error and will therefor be indicative that the machine will scan outside of the desired die areas when testing an IC photomask.

7 Claims, 2 Drawing Figures

TEST MASK FOR DETERMINING ALIGNMENT OF AN AUTOMATIC IC MASK TESTING APPARATUS

The present invention is related to apparatus for automatically testing masks such as photomasks utilized in the manufacture of semiconductor devices and specifically is related to a test mask for determining the alignment of such an apparatus.

BACKGROUND OF THE INVENTION

The manufacture of large scale integrated circuit chips requires extremely complex equipment and stringent procedures in order to maintain production losses at an acceptable level. Such losses are frequently due to defects in one or more of the various masks used in the manufacturing process. These defects are usually in the nature of a clear spot in an area which should be opaque or an opaque spot in an area which should be clear. As circuit complexity increases and device geometries become smaller, the effect of photomask quality upon final yield becomes increasingly significant.

Visual inspection of these photomasks is quite time consuming and yields mixed results due to inherent subjectivity and varying operator skill levels. As integrated circuits become larger and more complex, such visual inspection becomes extremely difficult, if not impossible. The need for automated inspection systems was recognized resulting in the development of several such systems. Typical of these automated inspection systems is the Mask Analysis system disclosed in U.S. Pat. No. 4,218,142 which issued Aug. 19, 1980 to Kryger et al. Kryger et al. utilizes a laser driven scanning spot which scans a particular chip area of the mask comparing the signal received from the scanning device with a data base containing standard data representing an ideal mask.

A more modern and widely used automated inspection system is the KLA-101 series automatic photomask inspection system which is manufactured by KLA Instruments Corp. of Santa Clara, California. The KLA-101 machine, which utilizes an image scanning system, simultaneously scans two different die areas on the same mask. All die areas on a given mask should contain identical patterns. If a difference is detected between two die areas, comparison with a third will determine which die area is defective. Alignment of the machine with the photomask to be inspected is accomplished manually by visually aligning each of the two sets of optics on their respective die areas. Identical features of the two die areas are selected so that the optics are imaging nominally identical patterns. As the photomask is scanned by the system, the scanning signal is gated to exclude signals generated while the scanner is outside of the die area. The die area is commonly referred to within the industry as the care area.

Occasionally, the KLA machine will become misaligned and scan slightly outside of the care area thereby giving erroneous indications of defects and failing to detect actual defects occurring within the care area. Heretofore, there has been no reliable and simple way for an operator to determine whether or not the machine is scanning outside of the desired care area. The present invention permits an operator to easily make this determination by means of a novel test mask.

SUMMARY OF THE INVENTION

The present invention includes a mask for determining whether or not an automatic integrated circuit (IC) mask testing apparatus is scanning within a desired care area. The mask comprises a substrate having a major surface and a plurality of identical care areas defined on the surface in substantially parallel rows. Each of the care areas is surrounded by a peripheral region on the surface which is adjacent an edge of the care area and extends outwardly therefrom. Portions of the peripheral regions have first optical properties and other portions have second optical properties so that for a pair of care areas, each portion of the peripheral region of one of the pair having first optical properties spatially corresponds to a portion of the peripheral region of the other of the pair having second optical properties.

DESCRIPTION OF THE PREFERRED EMBODIMENT

Figure 1:
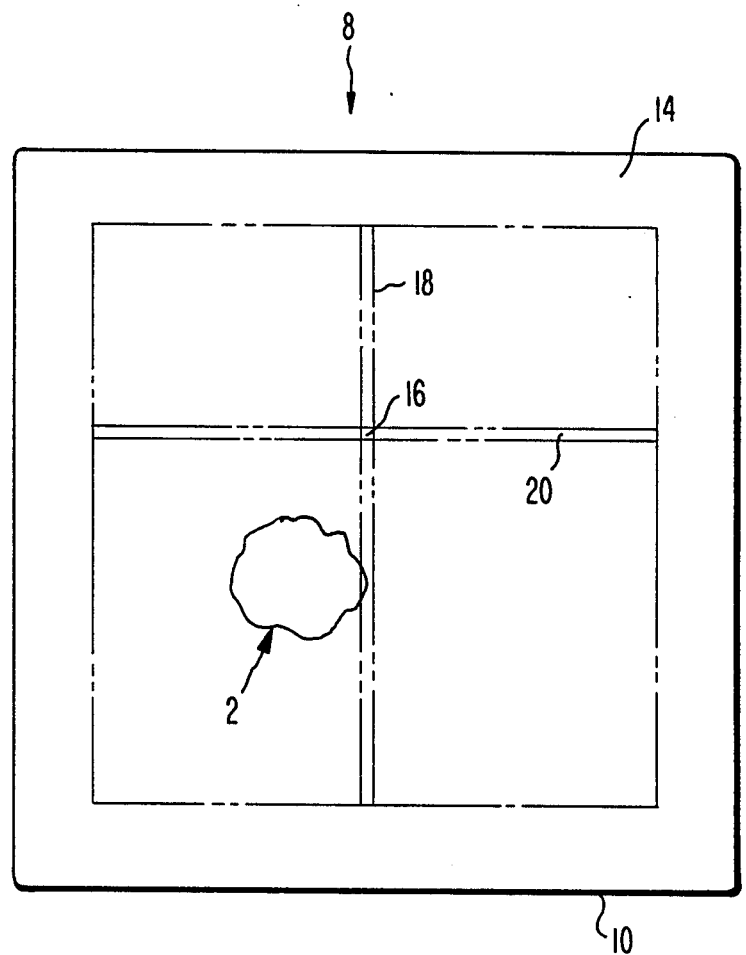
FIG. 1 is a plan view of a test mask utilizing the teachings of the present invention.

There is shown in FIG. 1 a test mask 8 having a rectangular shaped substrate 10, which may be made, for example, of glass, having a layer 14 of an optically opaque material, such as chromium, deposited thereon. By selectively removing specific portions of the layer 14, using techniques that are well known in the art, multiple micro-miniature patterns 16, or care areas, comprising transparent and opaque regions can be formed.

While the present example is set forth in terms of optically opaque regions and transparent or non-opaque regions, these terms, opaque and non-opaque, are more generically identified by the terms first optical properties and second optical properties respectively. The terms first and second optical properties are intended to include electromagnetic radiation within the approximate range of, and including, infrared through X-ray. It will be pointed out later in this specification some other possible specific examples of the first and second optical properties which may be utilized in the practice of the present invention.

Figure 2:
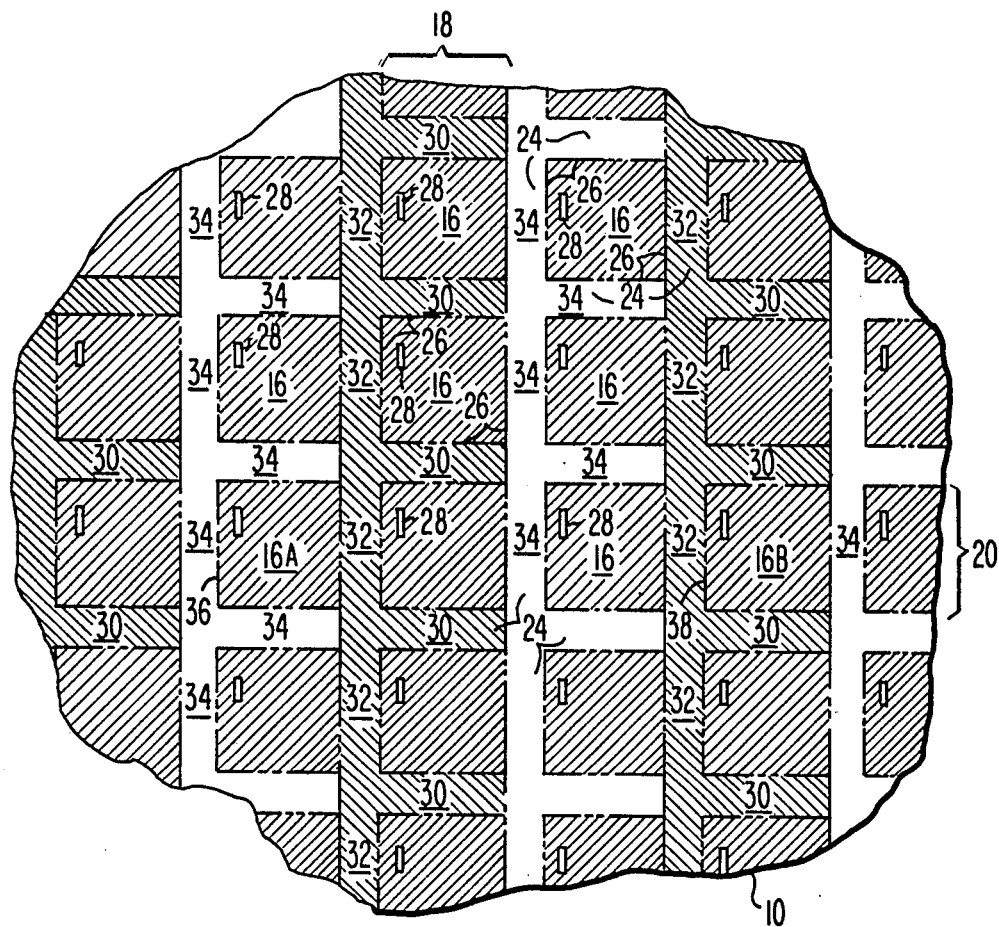
FIG. 2 is an enlarged view of a portion of FIG. 1 indicated at 2, showing a number of care areas and their surrounding peripheral regions.

As best seen in FIG. 1, the care areas 16 are arranged in spaced columns 18 and spaced rows 20 which substantially correspond to the die areas on a wafer, not shown. While the care areas 16 are in identical proportion to their corresponding die areas on a wafer, the peripheral regions 24 which surround each care area 16, see FIG. 2, are also in identical proportion to the streets between the die areas on a wafer, not shown. Note that, in FIG. 2, each care area 16 is defined by four phantom lines 26 which represent the outer limits of the care area 16 and, therefore, the corresponding die area on a wafer.

As shown in FIG. 2, the portions 30 of the peripheral regions 24 between the care areas 16 in alternate columns 18 as well as the vertical portions 32 on one side of the column 18 are opaque. All other portions 34 of the peripheral regions 24 are transparent or non-opaque. The significance of this opaque and non-opaque characterization will be explained below.

Each care area 16, which is otherwise opaque, includes a non-opaque feature 28 which is identical in all respects to all other features 28, all features 28 being identically positional within their respective care areas 16. The features 28 are used to visually align the two sets of optics of the KLA-101 automatic photomask inspection system, not shown, so that the optics are imaging nominally identical patterns on two different care areas.

As mentioned in BACKGROUND OF THE INVENTION, the scanning signal of the KLA-101 is gated to exclude signals generated while the scanner is outside of the care areas 16. Therefore, while scanning remains within the limits of the care areas 16, as represented by the gated scanning signals, the KLA-101 will not detect errors because the two different care areas 16 being scanned are both opaque and have no detectable differences. Those skilled in the art will understand that similar results would be obtained were the care areas 16 transparent, however, this would increase the likelihood of erroneous error indications due to possible presence of dust or other foreign particles on one of the transparent care areas 16. Should the scanning signals generated while the scanner is outside of the care area not be excluded due to misalignment of the machine, and the peripheral regions 24 being erroneously scanned were of opposite first and second optical properties, that is, one was opaque and the other non-opaque, the KLA-101 would indicate continuous detection of errors while scanning the peripheral regions 24. This would provide a valid indication to the operator that the KLA-101 was misaligned and scanning outside of the nominal care area 16.

The key to effecting such operation of the KLA-101 is to assure that the portions of the peripheral regions 24 being erroneously scanned have opposite first and second optical properties. That is, where the portion of the peripheral region 24 of one care area 16 being scanned by the one optical system is of one optical property, the spatially corresponding portion of the peripheral region 24 of the other care area 16 being scanned by the other optical system is of the other optical property. By way of example, assume that one optical system of the KLA-101 is aligned on the care area 16A and the other is aligned on the care area 16B of FIG. 2. Since both optical systems are imaging nominally identical patterns on the two care areas 16A and 16B, when the one is scanning the leftmost edge 36 of the care area 16A, the other one is scanning the leftmost edge 38 of the care area 16B resulting in no detected error. However, as the scan crosses the edges 36 and 38 into the peripheral regions 24, one optical system detects the non-opaque portion 34 while the other optical system detects the spatially corresponding portion 32 which is opaque, thereby indicating a detected error. While the scan continues in the peripheral region 24, detected errors are continuously indicated. Similarly, should the scan cross into the portions of the peripheral area 24 above, below, or to the right of the care areas 16A and 16B, as viewed in FIG. 2, the two optical system will encounter portions 30, 32, and 34 which are of opposite first and second optical properties and thereby indicate detected errors.

While a specific arrangement of opaque portions 30 and 32 and non-opaque portions 34 of the peripheral regions 24 is shown in FIG. 2 and described herein, numerous other arrangements may be used in the practice of the present invention. Again, the key requirement are that the spatially corresponding portions of the peripheral regions 24 being scanned are of opposite first and second optical properties. All such arrangements are deemed to be within the spirit and scope of the present invention.

Similar results are obtainable where the first and second optical properties of the portions 30, 32, and 34 allow or block reflection of radiation instead of transmission or non-transmission of radiation as set forth above. For example, the first optical property may reflect radiation of one wavelength while the second optical property may absorb that wavelength. The automatic photomask testing machine would then indicate an error whenever it failed to detect the specific wavelength of radiation on both scanners. In another example, the first optical property may absorb substantially all wavelengths of radiation, while the second optical property reflects substantially all wavelengths of radiation. In these two examples the KLA-101 would be arranged to detect reflected radiation instead of transmitted radiation.

I claim:

1. A mask for determining whether or not an automatic IC mask testing apparatus is scanning within a desired care area comprising:
    (a) a substrate having a major surface;
    (b) a plurality of identical care areas defined on said surface in substantially parallel rows, each of said care areas, having first optical properties and being surrounded by peripheral region on said surface which is adjacent an edge of said care area and extends outwardly therefrom,
    wherein portions of said peripheral regions have said first optical properties and other portions of said peripheral regions have second optical properties so that for a pair of said care areas, each portions of said peripheral region of one of said pair having said first optical properties spatially corresponds to a portion of said peripheral region of the other of said pair having said second optical properties.

2. The mask set forth in claim 1 wherein said pair of care areas are in the same one of said rows.

3. The mask set forth in claim 2 wherein said care areas are of rectangular shape.

4. The mask set forth in claim 3 wherein said plurality of identical care areas are further defined on said surface in substantially parallel columns and spaced apart so that the portion of said peripheral regions therebetween extend from the edges of the care areas in one column to the edges of the care areas in an adjacent column and the portions of said peripheral regions of said care areas between adjacent rows extend from the edges of the care areas in one row to the edges of the care areas in an adjacnt row.

5. The mask set forth in claim 4 wherein said portions of said peripheral regions between a pair of adjacent columns of said care areas have first optical properties and said portions of said peripheral regions between another pair of adjacent columns of said care areas have second optical properties.

6. The mask set forth in claim 5 wherein said first optical property substantially prevents transmission of radiation through said mask, and wherein said second optical property permits transmission of radiation therethrough.

7. The mask set forth in claim 5 wherein said first optical property substantially prevents reflection of radiation of a first wavelength, and wherein said second optical property permits reflection of radiation of said first wavelength.

* * * * *